US006980036B2

(12) United States Patent
Kwon et al.

(10) Patent No.: US 6,980,036 B2
(45) Date of Patent: Dec. 27, 2005

(54) SEMICONDUCTOR DEVICE COMPRISING FREQUENCY MULTIPLIER OF EXTERNAL CLOCK AND OUTPUT BUFFER OF TEST DATA AND SEMICONDUCTOR TEST METHOD

(75) Inventors: Kyoung-hwan Kwon, Seoul (KR); Hyun-soon Jang, Seoul (KR); Kyu-hyoun Kim, Suwon (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/671,105

(22) Filed: Sep. 25, 2003

(65) Prior Publication Data

US 2004/0061560 A1 Apr. 1, 2004

(30) Foreign Application Priority Data

Oct. 1, 2002 (KR) .................... 10-2002-0059831

(51) Int. Cl.[7] ............................................. H03B 19/00

(52) U.S. Cl. ..................................... 327/116; 327/119

(58) Field of Search ........................ 327/113, 114, 116, 327/119–122, 356

(56) References Cited

U.S. PATENT DOCUMENTS

| 5,805,611 A | * | 9/1998 | McClure ..................... 714/744 |
| 5,933,379 A | | 8/1999 | Park et al. .................. 365/201 |
| 6,058,057 A | | 5/2000 | Ochiai et al. ............... 365/201 |

FOREIGN PATENT DOCUMENTS

| DE | 19917320 A1 | 10/1999 |
| EP | 1168369 A2 | 1/2002 |
| JP | 11-304888 | 11/1999 |

* cited by examiner

*Primary Examiner*—Kenneth B. Wells
(74) *Attorney, Agent, or Firm*—Mills and Onello, LLP

(57) ABSTRACT

In a frequency multiplier and a method of multiplying a frequency of an external clock signal, a data output buffer, and a semiconductor device including the frequency multiplier and the data output buffer, the frequency multiplier receives an external clock signal having a predetermined frequency and outputs an internal clock signal having greater frequency than the predetermined frequency. In the semiconductor device, the data output buffer outputs data tested in response to test data. Therefore, it is possible to test a plurality of memory cells at a time by using a clock signal having a low frequency. In addition, the time and cost required for the test can be greatly reduced, and conventional testing equipment that operates at a relatively low frequency can be effectively used.

13 Claims, 6 Drawing Sheets

SEMICONDUCTOR DEVICE COMPRISING FREQUENCY MULTIPLIER OF EXTERNAL CLOCK AND OUTPUT BUFFER OF TEST DATA AND SEMICONDUCTOR TEST METHOD

BACKGROUND OF THE INVENTION

This application claims priority from Korean Patent Application No. 2002-59831, filed on Oct. 1, 2002, in the Korean Intellectual Property Office, the disclosure of which is incorporated herein in its entirety by reference.

1. Field of the Invention

The present invention relates to a semiconductor device, and more particularly to a frequency multiplier and a method of multiplying the frequency of an external clock signal, a data output buffer, and a semiconductor device including the frequency multiplier and the data output buffer.

2. Description of the Related Art

In a process of designing a semiconductor device, a memory chip is tested to determine whether any of its memory cells have defects, following its fabrication. Memory chip tests can be performed during the semiconductor manufacturing process and/or after the memory chip is manufactured to check for normal operation.

In the test that is performed following manufacture of the memory chip, data is input to the semiconductor device, output from an output terminal of the semiconductor device, and tested.

The tests are performed by using test equipment for testing the semiconductor device. The test equipment inputs an external clock signal to the semiconductor device and receives an output signal with respect to data written in a memory cell from the semiconductor device. The output signal received from the semiconductor device by the test equipment is thus used to determine whether the memory cell has any defects.

In order to perform the tests, the clock signal frequencies of the semiconductor device and the test equipment have to be same as each other so that the test equipment can detect data output from the semiconductor device without any errors. However, the operating speeds of the semiconductor device and the test equipment are often times different from each other.

In particular, as the operating speed of the semiconductor devices becomes higher, the operation speed of the test equipment cannot keep up with the operating speed of the semiconductor device. Thus, the test is performed at the operating speed of the test equipment.

For example, when the operating speed of the semiconductor device is 400 MHz, while the operating speed of the test equipment is 100 MHz, the test is performed at the operating speed of the test equipment, i.e., 100 MHz. Since the operating speed of the test equipment is constant and can be changed only after the test equipment itself is changed, the test has to be performed at the operating speed of the test equipment.

For a semiconductor device which operates at low speed, a limited test equipment operating speed is tolerable. However, as the operating speed and the memory capacity of the semiconductor device increase, the operating speeds of the semiconductor device and the test equipment are not the same as each other. Thus, the time required for the test increases, and the test therefore becomes inefficient.

Since the time necessary for the test is directly related to the manufacturing cost of the semiconductor device, an increase in the time necessary for the test causes an increase in the manufacturing cost of the semiconductor device, which causes the cost of the semiconductor device to increase.

Therefore, a semiconductor device, which can be tested by test equipment at a low operating speed and can operate at a high speed, is required.

SUMMARY OF THE INVENTION

The present invention provides a frequency multiplier and a method of multiplying an external clock signal having a low clock signal frequency to obtain a clock signal having a high clock signal frequency in order to make a semiconductor device having a high operating speed compatible with peripheral devices having low operating speeds.

The present invention also provides a data output buffer which outputs data written in the semiconductor device to test the semiconductor device so that the semiconductor device can have a high operating speed compatible with peripheral devices having low operating speeds.

The present invention also provides a semiconductor device including the frequency multiplier and the data output buffer.

According to an aspect of the present invention, there is provided a frequency multiplier which receives an external clock signal having a predetermined frequency, multiplies the external clock signal, and outputs the multiplied signal as an internal clock signal, the frequency multiplier comprising a first pulse signal generating circuit which receives a first clock signal and a second clock signal that have the same frequency as each other and generates a first pulse signal having a first pulse width when the level of the first clock signal is greater than the level of the second clock signal; a second pulse signal generating circuit which is enabled in response to a first control signal, receives a reference voltage and the first clock signal, and generates a second pulse signal having a second pulse width when the level of the reference voltage is greater than the level of the first clock signal; and an OR circuit which receives the first pulse signal and the second pulse signal, logically sums the first pulse signal and the second pulse signal, and outputs the logically summed signal as the internal clock signal.

Preferably, the first pulse signal generating circuit further comprises a first differential amplifier which receives the first clock signal and the second clock signal, senses a difference between the first clock signal and the second clock signal, and amplifies the difference; and a first logic circuit which receives an output signal of the first differential amplifier and generates the first pulse signal corresponding to the output signal of the first differential amplifier.

Preferably, the second pulse signal generating circuit further comprises a second differential amplifier which is enabled in response to the first control signal, receives a reference voltage and the first clock signal, senses a difference between the reference voltage and the first clock signal, and amplifies the difference; and a second logic circuit which receives an output signal of the second differential amplifier and generates the second pulse signal corresponding to the output signal of the second differential amplifier.

Preferably, the first pulse signal and the second pulse signal have the same pulse width as each other.

According to another aspect of the present invention, there is provided a frequency multiplier which receives an external clock signal having a predetermined frequency, multiplies the external clock signal, and outputs the multiplied signal as an internal clock signal, the frequency multiplier comprising a first pulse signal generating circuit which receives a first clock signal and a second clock signal having the same frequency and outputs a first pulse signal having a first pulse width when the level of the first clock signal is greater than the level of the second clock signal; a second pulse signal generating circuit which is enabled in response to a first control signal and outputs a second pulse signal having a second pulse width when the level of the reference voltage is greater than the level of the first clock signal; a third pulse signal generating circuit which is enabled in response to a second control signal and the reference voltage and outputs a third pulse signal having a third pulse width when the level of the second clock signal is greater than the level of the reference voltage; a fourth pulse signal generating circuit which is enabled in response to a second control signal, receives the reference voltage and the second control signal, and outputs a fourth pulse signal having a fourth pulse width when the level of the reference voltage is greater than the level of the second clock signal; and an OR circuit which receives the first pulse signal, the second pulse signal, the third pulse signal, and the fourth pulse signal, and outputs the internal clock signal which is the logical sum of the first pulse, the second pulse signal, the third pulse signal, and the fourth pulse signal.

Preferably, the first pulse signal generating circuit further comprises a first differential amplifier which receives the first clock signal and the second clock signal, senses a difference between the first clock signal and the second clock signal, and amplifies the difference; and a first logic circuit which receives an output signal of the first differential amplifier and generates the first pulse signal corresponding to the output signal of the first differential amplifier.

Preferably, the first control signal is enabled in a dual edge mode, and the second control signal is enabled in a quadrature edge mode.

According to another aspect of the present invention, there is provided a data output buffer of a semiconductor device comprising N flip flops which receive a first clock signal, are connected in series to each other, and have the same configuration as a first flip flop that receives data to be output from the semiconductor device, is synchronized with the first clock signal, and outputs the data, and a second flip flop that receives an output signal of the first flip flop, is synchronized with the first clock signal, and outputs the output signal of the first flip flop; an OR circuit which receives output signals from the N flip flops, logically sums the output signals, and outputs the signal obtained by the summation; and an output circuit which is synchronized with a second clock signal and outputs the output signal of the OR circuit, wherein the clock signal frequency of the first clock signal is N times greater than the clock signal frequency of the second clock signal.

Preferably, the data output buffer includes 4 flip flops which are connected in series with each other.

According to another aspect of the present invention, there is provided a semiconductor device comprising a frequency multiplier which is placed in an input terminal of the semiconductor device, receives a clock signal having a predetermined frequency, and outputs an internal clock signal having greater frequency than the predetermined frequency; and a data output buffer which outputs data tested according to data written to test the semiconductor device, wherein the frequency multiplier comprises a first pulse signal generating circuit which receives a first clock signal and a second clock signal having the same frequency as each other and outputs a first pulse signal having a first pulse width when the level of the first clock signal is greater than the level of the second clock signal; a second pulse signal generating circuit which is enabled in response to a first control signal and outputs a second pulse signal having a second pulse width when the level of the reference voltage is greater than the level of the first clock signal; a third pulse signal generating circuit which is enabled in response to a second control signal and the reference voltage and outputs a third pulse signal having a third pulse width when the level of the second clock signal is greater than the level of the reference voltage; a fourth pulse signal generating circuit which is enabled in response to a second control signal, receives the reference voltage and the second control signal, and outputs a fourth pulse signal having a fourth pulse width when the level of the reference voltage is greater than the level of the second clock signal; and an OR circuit which receives the first pulse signal, the second pulse signal, the third pulse signal, and the fourth pulse signal and outputs the internal clock signal which is multiplied by the first pulse, the second pulse signal, the third pulse signal, and the fourth pulse signal.

According to another aspect of the present invention, there is provided a method of multiplying a frequency where a clock signal having a predetermined frequency is received, the received clock signal is multiplied, and the multiplied signal is output as an internal signal, the method comprising generating a first pulse signal, which receives a first clock signal and a second clock signal and which has a first pulse width, when a level of the first clock signal is greater than a level of the second clock signal; generating a second pulse signal which is enabled in response to a first control signal, receives a reference voltage and the clock signal, and has a second pulse width, when the level of the reference voltage is greater than the level of the first clock signal; and receiving the first pulse signal and the second pulse signal, logically sums the first pulse signal and the second pulse signal, and outputting the signal obtained by the summation as the internal clock signal.

According to another aspect of the present invention, there is provided a method of multiplying a frequency where a clock signal having a predetermined frequency is received, the received clock signal is multiplied, and the multiplied signal is output as an internal signal, the method comprising generating a first pulse signal, which receives a first clock signal and a second clock signal which has the same frequency as each other and has a first pulse width, when the level of the first clock signal is greater than the level of the second clock signal; generating a second pulse signal which is enabled in response to a first control signal and has a second pulse width, when the level of the reference voltage is greater than the level of the first clock signal; generating a third pulse signal which is enabled in response to the second control signal and the reference voltage and has a third pulse width when a level of the second clock signal is greater than a level of the reference voltage; generating a fourth pulse signal which is enabled in response to a second control signal, receives the reference voltage and the second control signal, and has a fourth pulse width, when the level of the reference voltage is greater than the level of the second clock signal; and receiving the first pulse signal, the second pulse signal, the third pulse signal, and the fourth pulse signal and outputting the internal clock signal which is multiplied by the first pulse, the second pulse signal, the third pulse signal, and the fourth pulse signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
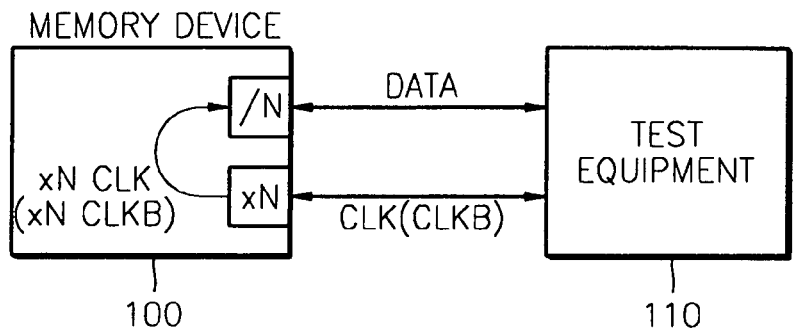
FIG. 1 is a schematic view of a semiconductor device and test equipment.

The present invention now will be described more fully with reference to the accompanying drawings, in which preferred embodiments of the invention are shown. In the drawings, like reference numerals are used to refer to like elements throughout.

FIG. 1 is a schematic view of a semiconductor device and test equipment. As shown in FIG. 1, a semiconductor memory device 100 interfaces with test equipment 110 in order to test the semiconductor device 100. However, the operating speeds of the semiconductor device 100 and the test equipment 110 are different from each other.

Thus, in the present invention, there is provided a frequency multiplier which receives external clock signals CLK and CLKB input from the test equipment 110 and multiplies the frequencies of the external clock signals CLK and CLKB by N times and a data output buffer which outputs data so as to interface data output from an output terminal of the semiconductor device 100 with the test equipment 110.

Figure 2:
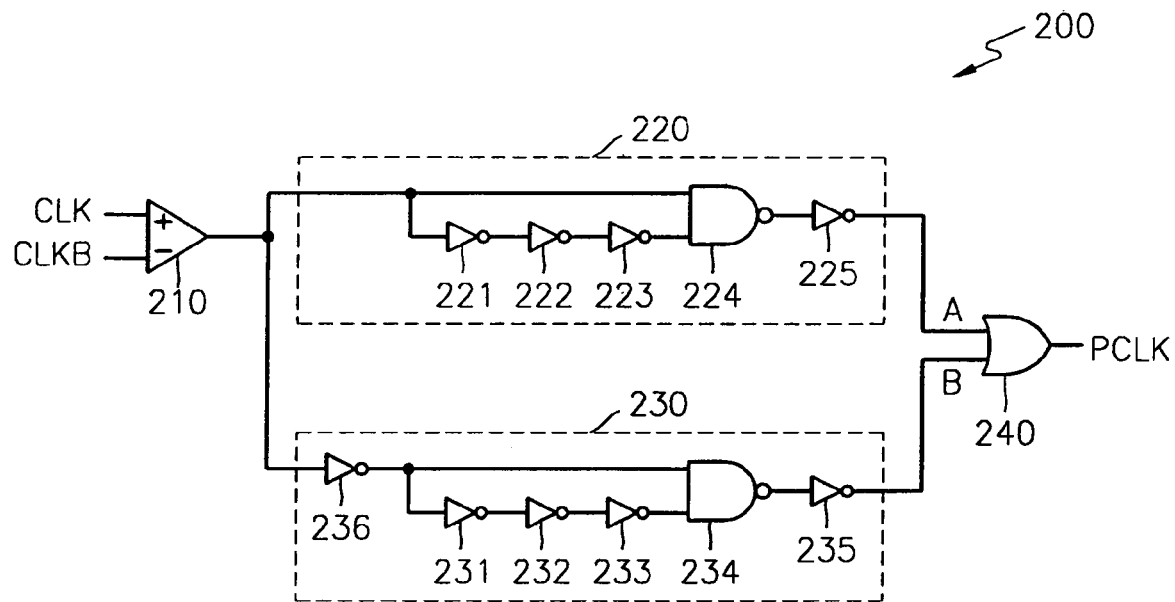
FIG. 2 is a circuit diagram of a conventional frequency multiplier.
Figure 3:
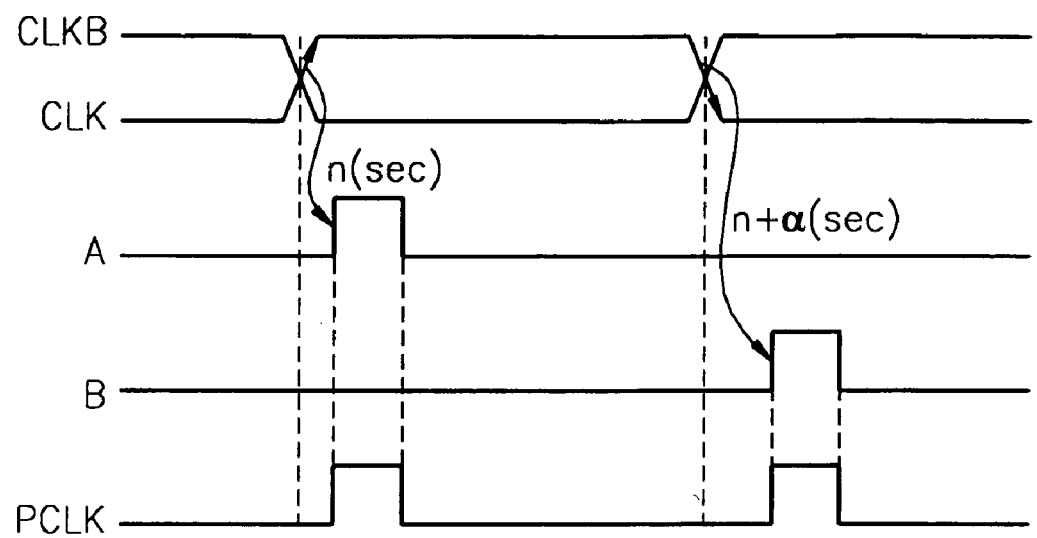
FIG. 3 is a timing diagram showing various signals of the frequency multiplier of FIG. 2.

FIG. 2 is a circuit diagram of a conventional frequency multiplier 200, and FIG. 3 is a timing diagram showing various signals of the frequency multiplier 200 of FIG. 2. The frequency multiplier 200 of FIG. 2 includes a differential amplifier 210, a first pulse signal generating unit 220, a second pulse signal generating unit 230, and an OR circuit 240.

The differential amplifier 210 receives external clock signals CLK and CLKB, amplifies a difference between the external clock signals CLK and CLKB, and outputs the amplified signal to the first pulse signal generating unit 220 and the second pulse signal generating unit 230. The first pulse signal generating unit 220 includes a plurality of inverters 221, 222, 223, and 225, and a NAND gate 224 to output a first pulse signal A having a predetermined pulse width at a rising edge of the external clock signal CLK.

The second pulse signal generating unit 230 includes a plurality of inverters 231, 232, 233, 235, and 236, and a NAND gate 234 to output a second pulse signal B having a predetermined pulse width at a falling edge of the external clock signal CLK. The OR circuit 240 outputs an internal clock signal PCLK by logically summing the first pulse signal A and the second pulse signal B.

As shown in FIG. 3, a skew occurs in generation of the second pulse signal B. This is due to a time difference between the first pulse signal generating unit 220 and the second pulse signal generating unit 230. That is, a skew corresponding to the delay (hereinafter, the delay is indicated by α) of the inverter 236 of the second pulse signal generating unit 230 occurs.

Figure 4:
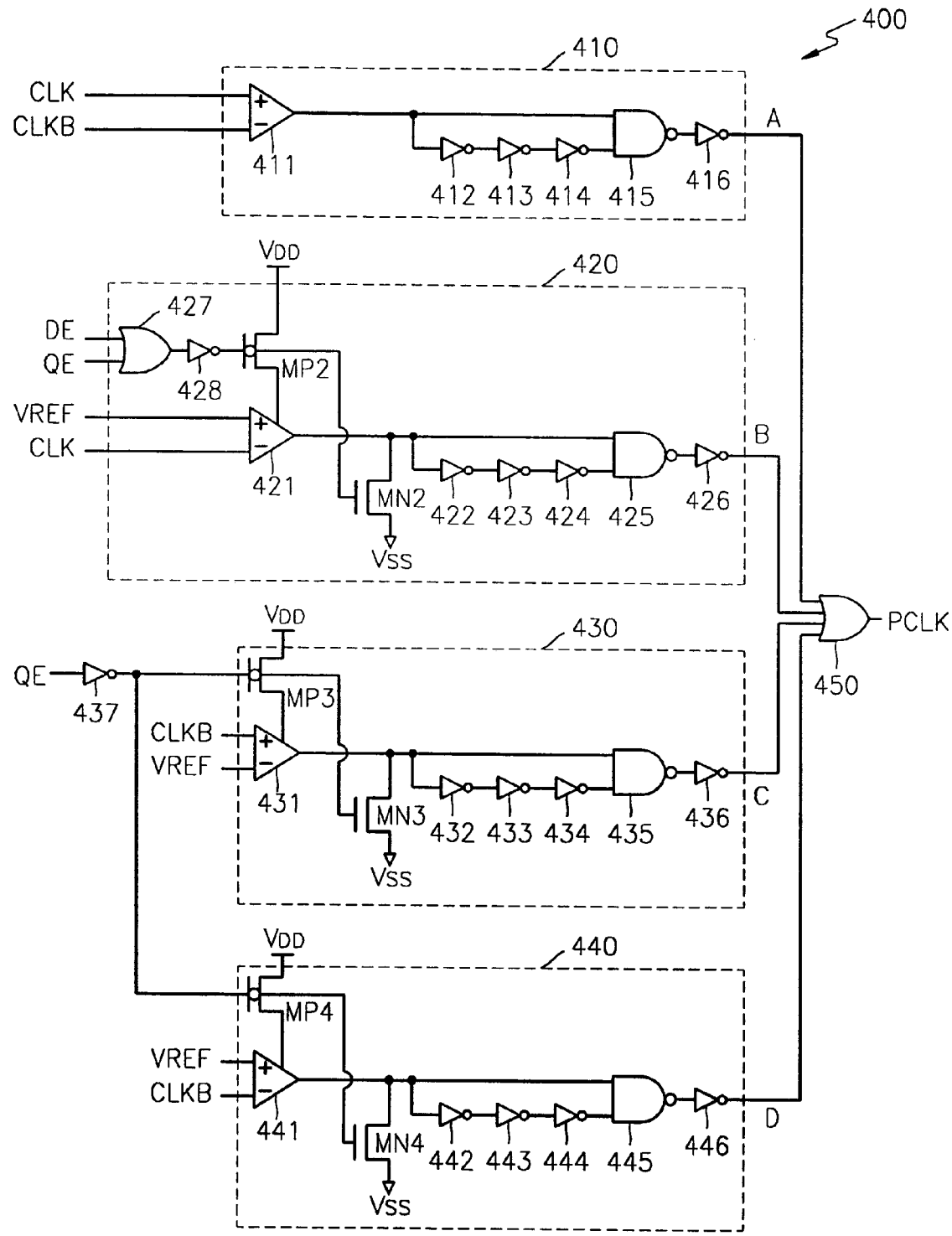
FIG. 4 is a circuit diagram of a frequency multiplier according to an embodiment of the present invention.
Figure 5:
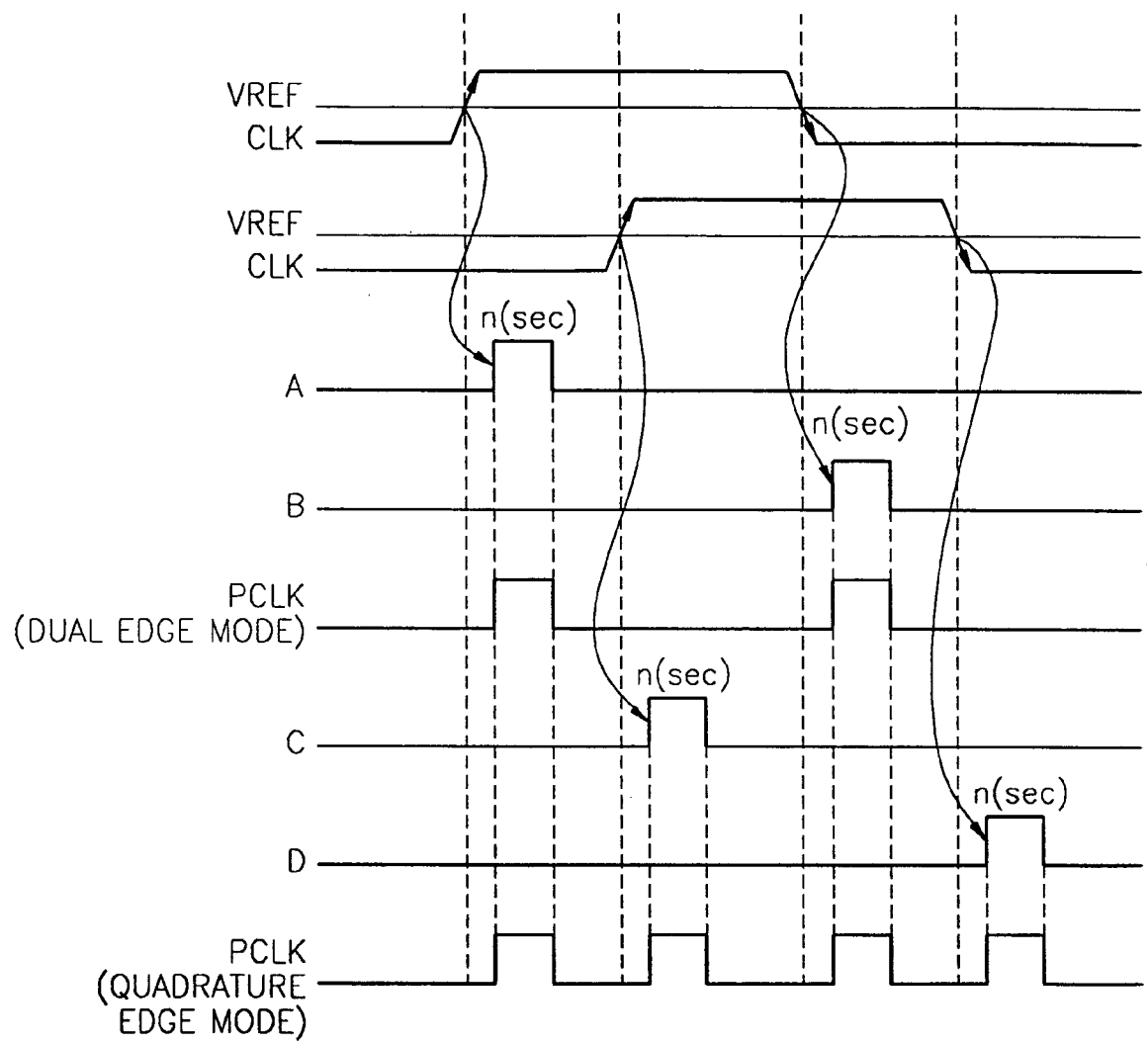
FIG. 5 is a timing diagram showing various signals of the frequency multiplier of FIG. 4.

FIG. 4 is a circuit diagram of a frequency multiplier 400 according to an embodiment of the present invention, and FIG. 5 is a timing diagram showing various signals of the frequency multiplier 400 of FIG. 4.

The frequency multiplier 400 of FIG. 4 includes a first pulse signal generating circuit 410, a second pulse signal generating circuit 420, a third pulse signal generating circuit 430, a fourth pulse signal generating circuit 440, and an OR circuit 450. The first pulse signal generating circuit 410 receives a first clock signal CLK and a second clock signal CLKB and outputs the first pulse signal A. The second pulse signal generating circuit 420 is enabled by a first control signal DE or a second control signal QE, receives a reference voltage VREF and the first clock signal CLK, and outputs the second pulse signal B.

The third pulse signal generating circuit 430 is enabled by the second control signal QE, receives the second clock signal CLKB and the reference voltage VFEF, and outputs a third pulse signal C. The fourth pulse signal generating circuit 440 is enabled by the inverted second control signal QE, receives the reference voltage VREF and the second clock signal CLKB, and outputs a fourth pulse signal D.

In this embodiment, the first pulse signal generating circuit 410 includes a differential amplifier 411 and a plurality of logic circuits 412, 413, 414, 415, and 416. The differential amplifier 411 receives the first clock signal CLK and the second clock signal CLKB, amplifies the difference between the first clock signal CLK and the second clock signal CLKB, and outputs the amplified signal. A first input terminal of the differential amplifier 411 receives the first clock signal CLK, and a second input terminal of the differential amplifier 411 receives the second clock signal CLKB.

A plurality of inverters 412, 413, and 414 are connected in series. That is, the inverter 412 receives an output signal of the differential amplifier 411 and inverts the received output signal to output. The inverter 413 receives an output signal of the inverter 412 and inverts the received output signal to output. The inverter 414 receives an output signal of the inverter 413 and inverts the received output signal to output.

A NAND gate 415 receives an output signal of the differential amplifier 411 and an output signal of the inverter 414, logically sums the output signals, and outputs the summation result. The inverter 416 receives an output signal of the NAND gate 415, inverts the received output signal and outputs the first pulse signal A.

The second pulse signal generating circuit 420 includes a differential amplifier 421 and a plurality of logic circuits 422, 423, 424, 425, and 426. The third pulse signal generating circuit 430 includes a differential amplifier 431 and a plurality of logic circuits 432, 433, 434, 435, and 436. The fourth pulse signal generating circuit 440 includes a differential amplifier 441 and a plurality of logic circuits 442, 443, 444, 445, and 446. The second pulse signal generating circuit 420, the third pulse signal generating circuit 430, and the fourth pulse signal generating circuit 440 have the same configuration as the configuration of the first pulse signal generating circuit 410. That is, the differential amplifiers 421, 431, and 441, the plurality of inverters 422, 423, 424, 432, 433, 434, 442, 443, and 444, the NAND gates 425, 435, and 445, and the inverters 426, 436, and 446 are connected to each other in the same manner as in the first pulse signal generating circuit 410.

A first input terminal of the differential amplifier 421 of the second pulse signal generating circuit 420 receives the reference voltage VREF, and a second input terminal of the differential amplifier 421 receives the first clock signal CLK. A first input terminal of the differential amplifier 431 of the third pulse signal generating circuit 430 receives the second clock signal CLKB, and a second input terminal of the differential amplifier 431 of the third pulse signal generating circuit 430 receives the reference voltage VREF. A first input terminal of the differential amplifier 441 of the fourth pulse signal generating circuit 440 receives the reference voltage VREF, and a second input terminal of the differential amplifier 441 of the fourth pulse signal generating circuit 440 receives the second clock signal CLKB.

The second pulse signal generating circuit 420 further includes a logic circuit 427 which logically sums a first control signal DE and a second control signal QE; an inverter 428 which inverts an output signal and outputs the inverted signal; a PMOS transistor MP2 the gate of which is connected to the output signal output from the inverter 428, the drain of which is connected to a supply voltage VDD, and the source of which is connected to the positive power supply terminal of the differential amplifier 421; and an NMOS transistor MN2 the gate of which is connected to the output signal output from the inverter 428, the drain of which is connected to the output terminal of the differential amplifier 421, and the source of which is connected to a ground voltage VSS.

The third pulse signal generating circuit 430 and the fourth pulse signal generating circuit 440 each receive the second control signal QE; and each include an inverter 437 which inverts the second control signal QE; PMOS transistors MP3 and MP4, the gates of which are connected to an output signal output from the inverter 437, the drains of which are connected to the supply voltage VDD, and the sources of which are respectively connected to the differential amplifiers 431 and 441; and NMOS transistors MN3 and MN4 the gates of which are connected to the output signal output from the inverter 437, the drains of which are connected to output terminals of the differential amplifiers 431 and 441, and the sources of which are connected to the ground voltage VSS.

Referring to FIGS. 4 and 5, operations of the frequency multiplier according to the present invention will now be described. In FIG. 5, the first clock signal CLK, and the reference voltage VREF are shown. If the first control signal DE and the second control signal QE are disabled, the PMOS transistors MP2, MP3, and MP4 are turned off, thus the differential amplifiers 421, 431, and 441 do not operate. In addition, the NMOS transistors MN2, MN3, and MN4 are turned on, and the output terminals of the differential amplifiers 421, 431, and 441 are reset. In this case, only the differential amplifier 411 operates, and the first pulse signal A is generated. Therefore, in this case, a frequency is not multiplied.

If only the first control signal DE is enabled, and the second control signal QE is disabled, then the PMOS transistors MP3 and MP4 do not operate, and the NMOS transistors MN3 and MN4 are turned on. Thus, the third pulse signal C and the fourth pulse signal D are not output. However, after the first control signal DE is enabled, the logic circuit 427 outputs a logic high signal, so the inverter 428 outputs a logic low signal.

That is, since the inverter 428 outputs a low signal, the PMOS transistor MP2 is turned on, and the NMOS transistor MN2 is turned off. In this case, the second pulse signal generating circuit 420 operates. The second pulse signal B is generated by the second pulse signal generating circuit 420, and the logic circuit 450 outputs a clock signal having a frequency which is two times that of the external clock signal CLK or CLKB.

If the second control signal QE is enabled, regardless of whether the first control signal DE is enabled or disabled, the PMOS transistors MP2, MP3, and MP4 are turned on, and the NMOS transistors MN2, MN3, and MN4 are turned off. If the second control signal QE is enabled, the first pulse signal generating circuit 410 through the fourth pulse signal generating circuit 440 operate, and they respectively generate the first pulse signal A, the second pulse signal B, the third pulse signal C, and the fourth pulse signal D. Therefore, the OR circuit 450 outputs a clock signal having a frequency which is four times that of the external clock signal CLK or CLKB.

As described above, when the first control signal DE is enabled, the external clock signal is multiplied by 2, and when the first control signal QE is enabled, the external clock signal is multiplied by 4. Thus, the case where the first control signal DE is enabled is referred to as a dual edge mode, and the case where the second control signal QE is enabled is referred to as a quadrature edge mode.

Here, it is preferable that pulse widths of the first pulse signal A through the fourth pulse signal D are the same as one another. The pulse widths are determined by summing the delays of the plurality of inverters 412, 413, 414, 422, 423, 424, 432, 433, and 434 which are connected to each input terminal of the NAND gates 415, 425, 435, and 445.

That is, according to a frequency multiplier 400, it is possible to remove the skew of the pulse signals generated by the respective pulse signal generating circuits. In addition, the frequency multiplier 400 can operate in the dual edge mode or the quadrature edge mode by enabling one or both of the control signals corresponding to the respective pulse signal generating circuits.

The frequency multiplier 400 can operate in the dual edge mode and the quadrature edge mode. However, it can be understood by those skilled in the art that other configurations of the frequency multiplier 400 are capable of multiplying the external clock signal by 2, 4, 8, 16, etc, thus, the frequency multiplier 400 can operate in a multiple edge mode.

Figure 6:
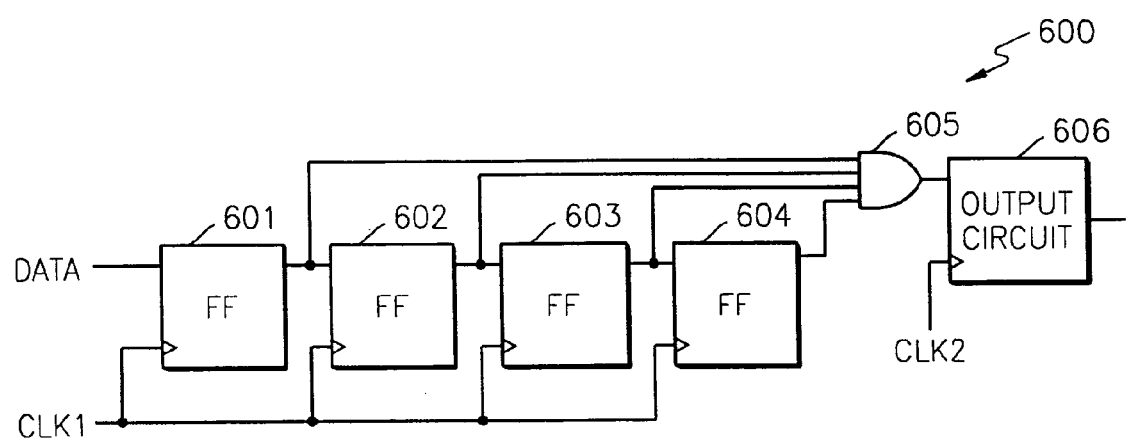
FIG. 6 is a schematic diagram of a data output buffer of a semiconductor device according to an embodiment of the present invention.

FIG. 6 is a schematic view of a data output buffer of a semiconductor device according to an embodiment of the present invention. In FIG. 6, a data output buffer 600 includes a plurality of flip flops 601, 602, 603, and 604, an OR circuit 605, and an output circuit 606.

The first flip flop 601 receives data DATA from a semiconductor device (not shown), is synchronized with a first clock signal CLK1, and outputs data DATA. A second flip flop 602 receives the output signal from the first flip flop 601, is synchronized with the first clock signal CLK1, and outputs the output signal of the first flip flop 601. In FIG. 6, a plurality of flip flops 601, 602, 603, and 604 and the data output buffer 600 are connected to each other as shown.

The OR circuit 605 receives output signals from the plurality of flip flops 601, 602, 603, and 604, logically sums the output signals and outputs the summation result. The output circuit 606 receives the output signal of the OR circuit 605, is synchronized with a second clock signal CLK2, and outputs the output signal of the OR circuit 605.

The data output buffer 600 can include N (N is a natural number that is greater than 2) number of flip flops, and the data output buffer 600 shown in FIG. 6, where N is 4, is only an example. In addition, it is preferable that the clock signal frequency of the first clock signal CLK1 is N times the clock signal frequency of the second clock signal CLK2 (In FIG. 6, N is 4).

Hereinafter, the operation of the data output buffer 600 will be described with reference to FIG. 6. After a semiconductor device is tested, data DATA to be output is input to the data output buffer 600. Here, since the semiconductor device operates at a speed that is higher than an operating speed of the test equipment (not shown), the data output buffer is provided to interface data output at a high speed with the operating speed of the test equipment.

The first flip flop 601 receives data DATA, is synchronized with a first clock signal CLK1, and outputs data DATA. The second flip flop 602 receives an output signal of the first flip flop 601, is synchronized with the first clock signal CLK1, and outputs the output signal of the first flip flop 601. The third flip flop 603 receives an output signal of the second flip flop 602, is synchronized with the first clock signal CLK1, and outputs the output signal of the second flip flop 602. The fourth flip flop 604 receives an output signal of the third flip flop 603, is synchronized with the first clock signal CLK1, and outputs the output signal of the third flip flop 603.

If the data DATA is consecutively output, output signals of the respective flip flops 601, 602, 603, and 604 have consecutive data. The OR circuit 605 receives output signals of the flip flops 601, 602, 603, and 604 and outputs the output signals after logically summing the output signals. The output circuit 606 receives the output signal of the OR circuit 605 and outputs the output signal of the OR circuit 605 in response to the second clock signal CLK2. The output signal of the output circuit 606 is externally output and is input to the test equipment (not shown), and, in this manner, the semiconductor device can be tested by using the output signal of the output circuit 606.

The data DATA is, for example, representative of test results of the semiconductor device. That is, in the test of the semiconductor device, data is written as "1" in a memory cell, and the data is read out. Rather that testing one bit at a time, a plurality of bits are tested at any given time, which is referred to as a parallel bit test (PBT).

A comparing circuit is included in the semiconductor device. The comparing circuit compares the plurality of bits and outputs data. The comparing circuit can be configured to logically multiply the plurality of bits and output data. If the logic high is not output from the comparing circuit as a result of comparison, the memory cell is defective and the memory chip is determined as defective.

Figure 7:
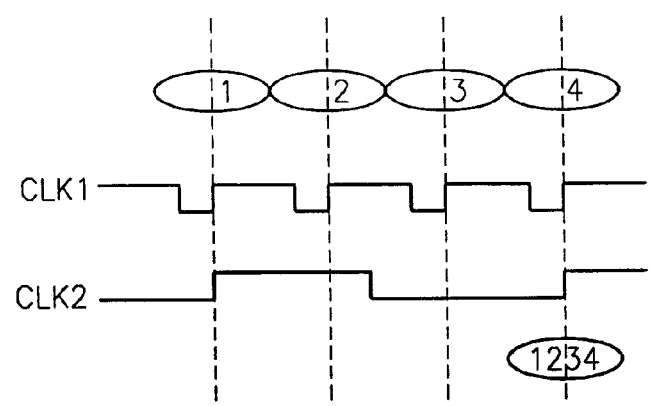
FIG. 7 is a timing diagram showing operations of the data output buffer of FIG. 6 and a clock signal.

FIG. 7 is a timing diagram showing operations of the data output buffer of FIG. 6 and a clock signal. Referring to FIG. 7, 4 data are sequentially stored in the flip flops 601–604 in response to the first clock signal CLK1, and output signals corresponding to comparison results of the 4 data are output in response to the second clock signal CLK2.

That is, as shown in FIGS. 6 and 7, tested data DATA are processed according to the first clock signal CLK1 which is faster than the second clock signal CLK2 by 4 times, and then the processed data DATA are output at a time according to the second clock signal CLK2. Thus, in this manner, the time required to test the semiconductor device can be greatly reduced.

Figure 8:
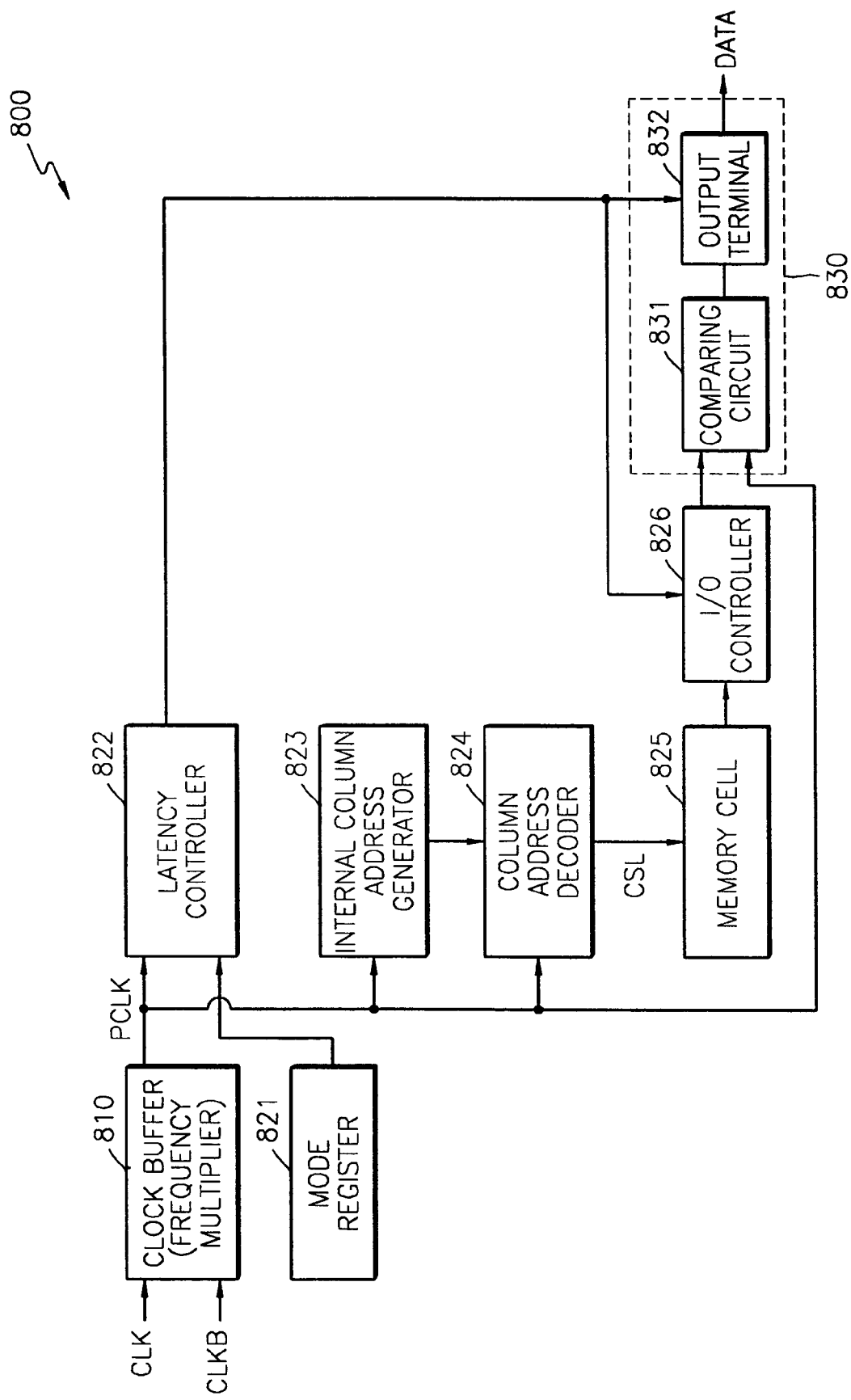
FIG. 8 is a block diagram showing a semiconductor device including the frequency multiplier and the data output buffer according to an embodiment of the present invention.

FIG. 8 is a block diagram showing a semiconductor device 800 including the frequency multiplier and the data output buffer according to an embodiment of the present invention. The semiconductor device 800 of FIG. 8 includes a frequency multiplier 810 and a data output buffer 830. A memory device of the semiconductor device 800 is tested as follows.

The frequency multiplier 810 receives the external clock signals CLK and CLKB and multiplies the frequencies of the external clock signals CLK and CLKB by N. An output signal of the frequency multiplier 810 is input to a latency controller 822, an internal column address generator 823, a column address decoder 824, and a comparing circuit 831 of the data output buffer 830.

The latency controller 822 controls the latency of the semiconductor device in response to an output signal of a mode register 821 and outputs a predetermined control signal to an output terminal 832 and an I/O controller unit 826. For test of the semiconductor device, the internal column address generator 823 is synchronized with an internal clock signal PCLK, generates an address, and outputs the address to the column address decoder 824.

The column address decoder 824 receives an output signal of the internal column address generator 823 and outputs a column select line (CSL) to a memory cell 825. Data in the memory cell 825 is read out in response to the column select line and is output via the I/O controlling unit 826, through the data output buffer 830 and to the outside of the semiconductor device. The data output external to the semiconductor device is input to test equipment (not shown). Thus, it is determined whether the semiconductor device operates abnormally by testing the data.

The semiconductor device 800 of FIG. 8 is capable of high speed operation in response to multiplied internal clock signal PCLK. In addition, the semiconductor device 800 includes the data output buffer 830 which outputs data in synchronization with a clock signal having the same frequency as that of the test equipment (not shown) when the semiconductor device 800 is tested.

As described above, the frequency multiplier according to the present invention can remove skew in a pulse signal generated by the frequency multiplier and multiply frequencies in various ways.

In addition, the data output buffer, the frequency multiplier, and the semiconductor device having the data output buffer and the frequency multiplier according to the present invention can test a plurality of memory cells at a time by using a clock signal having a low frequency. Thus, the time and cost required for testing can be greatly reduced, and conventional test equipment that operates at a low frequency can be effectively used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a frequency multiplier at an input terminal of the semiconductor device that receives a clock signal having a predetermined frequency, and that generates a first internal clock signal having a frequency that is greater than the predetermined frequency,
   a latency controller that controls a latency of the semiconductor device in response to the first internal clock signal and that generates a second internal clock signal according to the latency control result, a data output buffer that outputs test output data for the semiconductor device in response to the first and second internal clock signals, wherein the frequency multiplier comprises:

a first pulse signal generating circuit that receives a first clock signal and a second clock signal having the same frequency and that generates a first pulse signal having a first pulse width when a level of the first clock signal is greater than a level of the second clock signal, a second pulse signal generating circuit that is enabled in response to a first control signal, and that generates a second pulse signal having a second pulse width when a level of a received reference voltage is greater than a level of the first clock signal, and an OR circuit that receives the first pulse signal and the second pulse signal, that logically sums the first pulse signal and the second pulse signal, and that outputs the logically summed signal as the first internal clock signal.

2. The semiconductor device of claim 1, wherein the first pulse signal generating circuit comprises:

a first differential amplifier that receives the first clock signal and the second clock signal, and that senses and amplifies a difference between the first clock signal and the second clock signal; and a first logic circuit that receives an output signal of the first differential amplifier and that generates the first pulse signal in response to the output signal of the first differential amplifier.

3. The semiconductor device of claim 1, wherein the second pulse signal generating circuit further comprises:

a second differential amplifier that is enabled in response to the first control signal, and that senses and amplifies a difference between the reference voltage and the first clock signal; and a second logic circuit that receives an output signal of the second differential amplifier and that generates the second pulse signal in response to the output signal of the second differential amplifier.

4. The semiconductor device of claim 1, wherein the data output buffer comprises:

N flip flops, connected in series with each other, that each receive the first internal clock signal, including: a first flip flop that receives data to be output from the semiconductor device and that outputs data in synchronization with the first internal clock signal; and second through Nth flip flops that each receive an output signal of a preceding flip flop in the series and that output the data of the preceding flip flop in synchronization with the first internal clock signal;

an OR circuit that receives output signals of the N flip flops, logically sums the output signals, and outputs the summation signal; and an output circuit that is synchronized with the second internal clock signal and outputs the summation signal of the OR circuit, wherein the clock signal frequency of the first internal clock signal is N times greater than the clock signal frequency of the second internal clock signal.

5. The semiconductor device of claim 1, wherein the first pulse signal and the second pulse signal have the same pulse width.

6. A semiconductor device comprising:

a frequency multiplier at an input terminal of the semiconductor device, that receives a clock signal having a predetermined frequency, and that generates a first internal clock signal having a frequency that is greater than the predetermined frequency, a latency controller that controls a latency of the semiconductor device in response to the first internal clock signal and that generates a second internal clock signal according to the latency control result, and a data output buffer that outputs test output data for the semiconductor device in response to the first and second internal clock signals, wherein the frequency multiplier comprises:

a first pulse signal generating circuit that receives a first clock signal and a second clock signal having the same frequency and that generates a first pulse signal having a first pulse width when a level of the first clock signal is greater than a level of the second clock signal, a second pulse signal generating circuit that is enabled in response to a first control signal and that generates a second pulse signal having a second pulse width when a level of a received reference voltage is greater than a level of the first clock signal, a third pulse signal generating circuit that is enabled in response to a second control signal and that generates a third pulse signal having a third pulse width when a level of the second clock signal is greater than a level of the reference voltage, a fourth pulse signal generating circuit that is enabled in response to the second control signal, and that generates a fourth pulse signal having a fourth pulse width when a level of the reference voltage is greater than a level of the second clock signal, and an OR circuit that receives the first pulse signal, the second pulse signal, the third pulse signal, and the fourth pulse signal and that outputs the first internal clock signal that is the logical sum of the first pulse signal, the second pulse signal, the third pulse signal, and the fourth pulse signal.

7. The semiconductor device of claim 6, wherein the first pulse signal, the second pulse signal, the third pulse signal, and the fourth pulse signal have the same width.

8. The semiconductor device of claim 6, wherein the first control signal is enabled in a dual edge mode and the second control signal is enabled in a quadrature edge mode.

9. The semiconductor device of claim 6, wherein the data output buffer comprises:

N flip flops, connected in series with each other, that each receive the first internal clock signal, including: a first flip flop that receives data to be output from the semiconductor device and that outputs data in synchronization with the first internal clock signal; and second through Nth flip flops that each receive an output signal of a preceding flip flop in the series and that output the data of the preceding flip flop in synchronization with the first internal clock signal;

an OR circuit that receives output signals of the N flip flops, logically sums the output signals, and outputs the summation signal; and an output circuit that is synchronized with the second internal clock signal and outputs the summation signal of the OR circuit, wherein the clock signal frequency of the first internal clock signal is N times greater than the clock signal frequency of the second internal clock signal.

10. The semiconductor device if claim 9, wherein the data output buffer includes 4 flip flops that are connected in series with each other.

11. The semiconductor device of claim 6, wherein the first clock signal has a frequency 4 times greater than the second clock signal.

12. A method of testing a semiconductor device, the method comprising:
- receiving a clock signal having a predetermined frequency and generating a first internal clock signal having greater frequency than the predetermined frequency,
- controlling a latency of the semiconductor device in response to the first internal clock signal and generating a second internal clock signal according to the latency control result, and
- outputting test output data for the semiconductor device using the first and second internal clock signals, wherein generating the first internal clock signal includes:
- receiving a first clock signal and a second clock signal and generating a first pulse signal having a first pulse width when a level of the first clock signal is greater than a level of the second clock signal,
- generating, in response to a first control signal, a second pulse signal having a second pulse width when a level of a received reference voltage is greater than a level of the first clock signal, and
- logically summing the first pulse signal and the second pulse signal and outputting the signal obtained by the summation as the first internal clock signal.

13. A method of testing a semiconductor device, the method comprising:
- receiving a clock signal having a predetermined frequency and generating a first internal clock signal having greater frequency than the predetermined frequency,
- controlling a latency of the semiconductor device in response to the first internal clock signal and generating a second internal clock signal according to the latency control result, and
- outputting test output data for the semiconductor device using the first and second internal clock signals, wherein generating the first internal clock signal includes:
- receiving a first clock signal and a second clock signal having the same frequency and generating a first pulse signal having a first pulse width when a level of the first clock signal is greater than a level of the second clock signal,
- generating, in response to a first control signal, a second pulse signal having a second pulse width when a level of a received reference voltage is greater than a level of the first clock signal,
- generating, in response to a second control signal, a third pulse signal having a third pulse width when a level of the second clock signal is greater than a level of the reference voltage,
- generating, in response to the second control signal, a fourth pulse signal having a fourth pulse width when a level of the reference voltage is greater than a level of the second clock signal, and
- logically summing the first pulse signal, the second pulse signal, the third pulse signal, and the fourth pulse signal, and outputting a signal obtained by the summation as the first internal clock signal.

* * * * *